June 20, 1967 K. D. KROSSA ETAL 3,327,236

GAIN SETTING SWITCHING CIRCUIT RESPONSIVE TO AUTOMATICALLY EMITTED DIGITAL LEVELS

Filed July 13, 1964 2 Sheets-Sheet 1

INVENTORS
KENNETH D. KROSSA
WUU LIN
BY
Christie, Parker & Hale
ATTORNEYS.

June 20, 1967 K. D. KROSSA ETAL 3,327,236

GAIN SETTING SWITCHING CIRCUIT RESPONSIVE TO AUTOMATICALLY EMITTED DIGITAL LEVELS

Filed July 13, 1964 2 Sheets-Sheet 2

INVENTORS.

KENNETH D. KROSSA
WUU LIN

BY Christie, Parker & Hale

ATTORNEYS.

3,327,236

GAIN SETTING SWITCHING CIRCUIT RESPONSIVE TO AUTOMATICALLY EMITTED DIGITAL LEVELS

Kenneth D. Krossa, Sierra Madre, and Wuu Lin, Pasadena, Calif., assignors to Burroughs Corporation, Detroit, Mich., a corporation of Michigan Filed July 13, 1964, Ser. No. 382,291
5 Claims. (Cl. 330—28)

Figure 1:
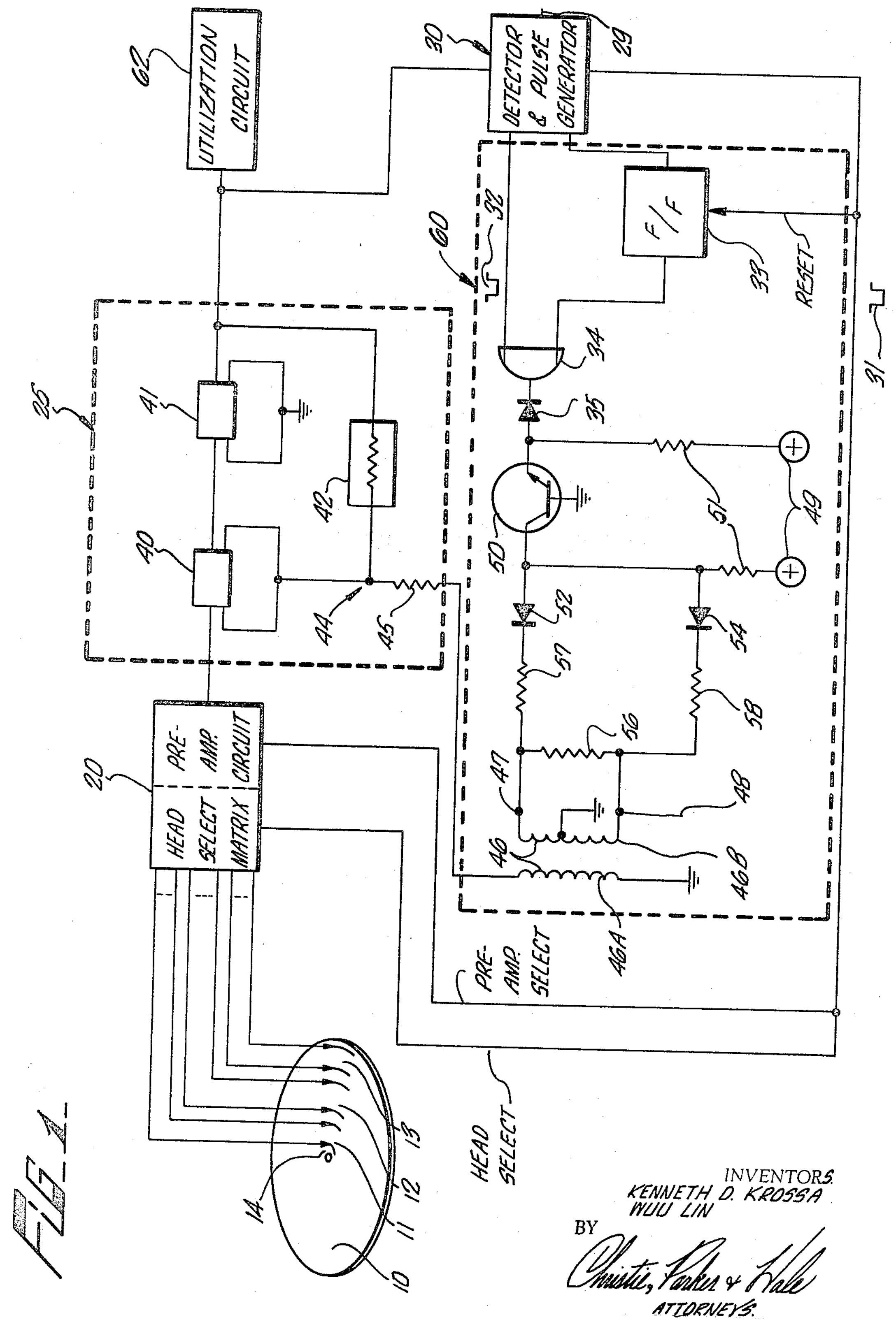

This invention relates to a combined amplifier and gain controlling circuit, and more particularly to a new and novel gain controlling circuit for establishing several distinct gain settings in an amplifier within a controllable short time constant and without introducing any significant transients in the amplifier circuitry during gain changing operations.

Today's information recovery systems require an amplifying circuit which can handle information signals which vary over wide ranges of amplitude. For example, such a system may be a disk file system which is more fully disclosed in a co-pending application by Kenneth D. Krossa and Michael I. Behr, having Ser. No. 382,321 filed concurrently herewith and assigned to the same assignee. Such a system produces widely varying amplitude information signals depending upon where such information signals are stored on a disk. As is true of most computer systems today, the disk file system is a high speed unit and its information sensing amplifier must be able to change gain quickly and accurately in order adequately to handle the wide range of amplitudes of the information signals. In order to obtain the numerous advantages associated with this high speed operation, an amplifier circuit must be able to recover quickly, i.e., have a short time constant, both when it is placed into operation and when a change in gain setting is required. Further, it is essential that noise transients of considerable duration be eliminated from the gain controlling circuit and the amplifier, because such transients are inherently variables and thus interfere with attempts to achieve a controlled time constant. Furthermore, considerable time is wasted while the circuit recovers from the unbalanced conditions established by such transients.

Gain settings in sensing amplifiers for such systems must be capable of being achieved automatically and electronically by signals which may advantageously have a step function. Prior art gain control circuits exist which include a signal responsive switching device which is operative for connecting an attenuating impedance to the input of an amplifier circuit. These prior art circuits alter the direct current operating conditions of the amplifier. If a D.C. coupled amplifier is employed, this change in operating conditions results in a shift in the output level which disrupts threshold detection, and requires expensive and complicated compatability design for utilization circuitry. If an A.C. coupled amplifier is employed, the sudden change in operating conditions introduces a long time constant transient. Such time constants are difficult, if not impossible, to control. These prior art circuits thus are not satisfactory in many high speed systems requiring variable gain settings.

Prior art automatic gain control circuits are known, but such circuits require considerable gain adjustment time. An automatic gain control circuit is a continuously operating scheme in which a large number of pulses must be sampled and compared with a reference in order to obtain a continuous feedback voltage that maintains proper gain adjustment for the amplifier. Accordingly, considerable time is wasted in achieving original gain stability. A further disadvantage of this prior art approach results from the fact that portions of the information on a disk file may consist of words made up of very few pulses.

Recovery of this type of information increases the time necessary for initial gain stability in an automatic gain control system, and also increases the possibility that an absence of pulses will prompt an increase in gain when none is required. Such an unwanted increase would cause considerable distortion in the information which is subsequently recovered and amplified at an incorrect gain setting.

The above disadvantages of the prior art are overcome by the combined amplifier and gain controlling circuit of this invention. The circuit of this invention utilizes a feedback amplifier in which the gain is a function of a feedback impedance divided by a control circuit impedance. This control circuit impedance has a value which is regulated in a new and novel manner to provide a controllable time constant, and to eliminate all shifts in the direct current operating conditions, and to eliminate transients during gain changes in the amplifier. This gain controlling circuit includes a bias source connected in common to twin circuits each including matched unilateral current conducting devices and matched resistors which are series-connected to ground through equal portions of a center tapped transformer. Another resistor is connected across the transformer and in parallel with the twin, or matched, circuits. A secondary winding which is inductively coupled to the center tapped transformer is connected to a control terminal for the amplifier so that a reflected impedance appears at that terminal. This reflected impedance changes in value dependent upon the conductive state of the unilateral current conduction devices as controlled by a switching device connected between ground and the common junction of the bias source and the matched circuits.

Figure 2:
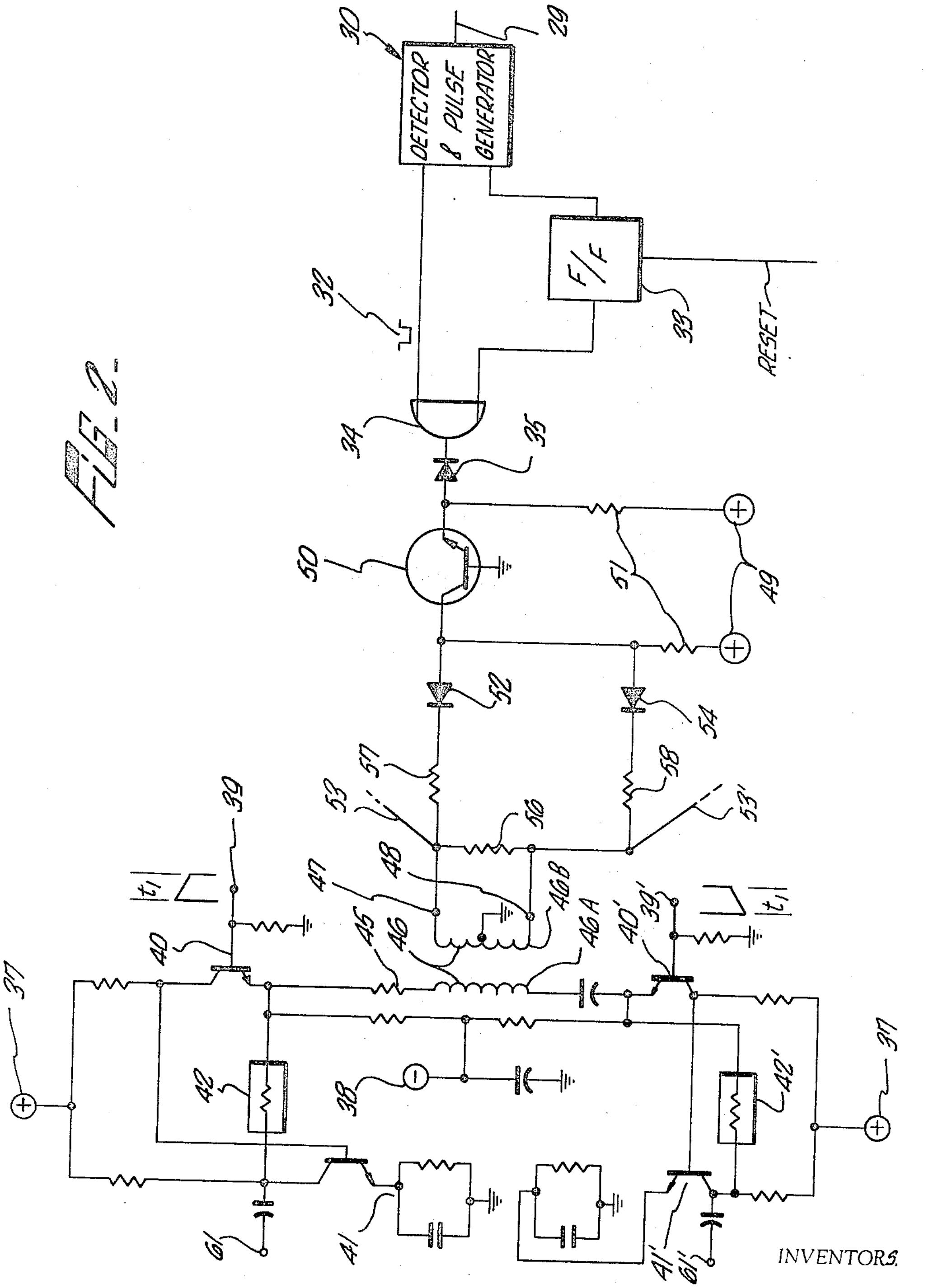

The invention is described in more detail by reference to the accompanying drawing in which;

FIG. 1 is a combined block diagram and schematic circuit of the amplifier and gain control circuit of this invention; and FIG. 2 is a detailed schematic circuit of a preferred embodiment of the amplifier of FIG. 1.

In FIG. 1 the amplifier 25, hereinafter referred to as a multi-gain amplifier, with its gain controlling circuit 60 of this invention is shown, for ease of understanding, in the representative environment of a disk file control system. Such a system includes a disk store 10 which may advantageously be provided with three different storage zones 11, 12 and 13, each having numerous information tracks. Reading heads 14 are positioned in relation to the disk store 10 such that information stored thereon magnetically induces information signals in each of the information recovery heads.

Although the disk store 10 rotates at a constant speed, the angular velocity of different portions of the disk is not constant, and the amplitude of the signals recovered is proportional to such lineal velocity. For example, the higher lineal velocity under an information recovery head near the periphery of the disk will cause a large amplitude signal as compared to a similar information signal recovered from an inside track of the disk. The range of amplitudes which are capable of being recovered from the innermost to the outermost periphery of disk store 10 far exceed the amplitude handling capabilities of a standard amplifier.

When any information recovery head is selected by a head select pulse applied to the head select matrix and pulse amplifier stage 20 in any well known manner from timing pulse generator 30, the information signal thus recovered is subjected to an initial pre-amplification operation. These pre-amplification stages may be standard in the art, and are adjusted with relation to the zones 11, 12 and 13, so that the pre-amplification for the innermost storage zone is correspondingly greater than the pre-amplification adjustment for the outer storage zone 13. This operation reduces considerably the range of amplitude of the information signals which are originally recovered from disk 10. Although this range is reduced, the amplitude variations of the signals recovered from an entire disk is nevertheless still too large for any single gain setting of an amplifier to handle.

The multi-gain amplifier 25 and gain controlling circuit 60 of this invention is capable of handling the aforementioned broad range of signal amplitudes. The amplifier circuit 25, operates in the system in a manner which is more fully described and claimed in the aforementioned patent application by Kenneth D. Krossa and Michael I. Behr, and reference can be made to that application for a complete and detailed description. Briefly however, amplifier 25 has several possible distinct gain levels, and it is initially set at one gain level during a sampling period while a representative pulse, which may be one of the information pulses, is amplified. This amplified signal is monitored by the level detector and pulse generator 30.

Circuit 30 performs a comparison operation between the amplitude of the amplified signal and a predetermined amplitude level of the detector circuit 30, and if the result of that comparison shows that the initial gain setting of the amplifier is the correct setting for the amplitude of the sample pulse, an output from the circuit 30 is operative to hold the amplifier in its initial level. On the other hand, if the comparison shows that a different gain setting is required, the detector and pulse generator 30 delivers an indication to gain controlling circuit 60 which is operative to set the amplifier at a correct gain level. This correct gain level is thereafter held during an entire information recovery process. The new and novel circuit operation by which the amplifier 25 and gain controlling circuit 60 of this invention initially assume one gain level, and thereafter in response to control pulses from detector and pulse generator 30 automatically achieves and holds a proper gain setting for an information recovery operation, is described in detail hereinafter.

In FIG. 1, a multi-gain amplifier 25 is diagrammatically represented as a two stage feedback amplifier by blocks 40 and 41 and by feedback resistor 42 which is connected to a gain control lead of the first amplifier stage 40. The amplifiers 40 and 41 may advantageously be transistor amplifiers which are biased for class A operation, in which the transistor is always conducting in the linear region of the collector characteristics, and in which the bias currents and the signal to be amplified are of proper magnitude to achieve this class A operation.

If, for example, the amplifier 40 comprises a grounded-emitter transistor, the gain of the amplifier, as is well known, is approximately expresed by the ratio of the feedback impedance divided by the emitter impedance. The emitter impedance will be that impedance which is regulated by gain controlling circuit 60 and which is between the gain control terminal 44 and ground. This control impedance includes resistor 45 in series with the impedance which is reflected into the primary winding 46A of transformer 46 by transformer winding 46B. The value of this reflected impedance in turn depends upon the turns ratio N of the transformer 46 and the impedance present across terminals 47 and 48 of transformer winding 46B.

The value of the impedance present across terminals 47 and 48 is determined by the conductive conditions of diodes 52 and 54 and transistor 50. If transistor 50 is fully conductive, diodes 52 and 54 will be back-biased and the effective resistance between terminals 47 and 48 is resistor 56. Accordingly, the resistance on the primary side 46A of transformer 46 is the value of the resistor 56 divided by the transformer's turns ratio squared. If the turns ratio of the transformer is unity, then the reflected resistance on the primary side becomes solely resistor 56. On the other hand, if transistor 50 is in a non-conductive condition the diodes 52 and 54 are forward-biased and conduct current from source 49. Operating in this manner resistors 57 and 58 are in parallel with resistor 56 and the resistance which is now reflected to primary winding 46A is decreased from the former value which was solely that of resistor 56. It should be understood that the diodes 52 and 54 each have a dynamic resistance when conductive, and these resistances which are in series with resistors 57 and 58, respectively, also contribute to the parallel resistance combination of resistor 56. With transistor 50 non-conductive and diodes 52 and 54 conductive, the reflected resistance is thus a small value in series with resistor 45, and for this reason the gain of the amplifier is at a high level, due to the inverse dependence of that gain on the resistance at control terminal 44.

The manner in which transistor 50 assumes its conductive and non-conductive conditions during an information recovery operation, and the manner in which the gain settings are achieved within a controlled time constant independent of any direct current transients may best be understood in connection with a brief discussion of the overall circuit operation of FIG. 1. Source 49 and the biasing resistors 51 are chosen to maintain the grounded based transistor 50 in a normally non-conductive condition, prior to the initiation of an information recovery operation. In the circuit of FIG. 1, an information recovery operation will be commenced by a start signal from a control unit which is not shown, and which applies this start signal on lead 29 to the level detector and timing pulse generator 30. In response to this start signal, the detector and pulse generator 30 generates two coincident output signals 31 and 32. Signal 31 activates the head select matrix and the pre-amplification stage, and also resets the flip-flop circuit 33. This pulse 31, by activation of matrix and pre-amplifier circuit 20, selects one information recovery head 14 and connects that information recovery head through the appropriate pre-amplifier to the first amplifier stage 40. Coincident pulse 32, applied to OR gate 34, forward biases diode 35 and initiates a conductive condition in transistor 50. In accordance with the foregoing description, the amplifier is thus initially set in its lowest gain level.

Information recovered from the disk 10 by the selected information recovery head 14 is representative of the amplitudes which will be recovered from that information track. The control pulse which initiated this operation, it should be understood, immediately precedes, the actual information which is desired from the selected track, and thus the utilization circuit 62 is not activated during this initial sampling period. The initial pulse recovered is amplified at the low gain setting, and the level detector and pulse generator 30 monitors the amplified output from amplifier 41, and is operative to deliver a signal to flip-flop 33 only if the amplitude of the representative signal exceeds a predetermined threshold voltage in the circuit 30. If the amplified signal exceeds this threshold level the low gain level is proper and flip-flop 33, which was previously reset by pulse 31, is placed in a "one" state by an output pulse from circuit 30. This "one" state through OR gate 34 places transistor 50 in a conductive condition which back-biases diodes 52 and 54 and thereafter maintains the multi-gain amplifier 25 in its low gain level throughout the information recovery period. During this information recovery period utilization circuit 62 is active, and information recovered from disk 10 is amplified and made available to it at the proper amplification level.

Just prior to a subsequent information recovery process the level detector and timing pulse generator 30 will apply another select and reset pulse 31 to the head select and preamplification circuit 20 and to flip-flop 33. For purposes of explanation assume that in the subsequent operation the head select matrix is operated to select one of the information recovery heads 14 from the innermost zone 11 of disk 10. At this inside portion of disk 10 the signals recovered are of smaller amplitude than signals from the other zones. The pre-amplified information received from this inside zone will, during the sampling period, be pre-amplified by multi-gain amplifiers 25 at the low gain level, which is assured by pulse 32 applied to OR gate 34 coincidentally with output pulse 31. In this instance the amplified output will not exceed the threshold level of circuit 30, and there is no output deliverd to flip-flop 33. Flip-flop 33, as previously described, was reset to a "zero" state by the pulse 31 from circuit 30. Accordingly, when the sampling period is over and pulse 32 is removed from OR gate 34 diode 35 becomes back-biased. Transistor 50 returns to its normally non-conductive state, and in the manner previously described, diodes 52 and 54 are forward-biased in order to reduce the value of the reflected impedance to primary winding 46A of transformer 46. The lower value of reflected resistance increases the gain for multi-gain amplifiers 25, and this high gain level will be maintained throughout this subsequent information recovery process. Information recovered from the innermost zone 11 is thus amplified at this higher gain level and is passed to the utilization circuit 62.

In the circuit operation just described, the multi-gain amplifier was originally set at its low gain level, however, this is only one possible mode of operation. Reference to the aforementioned patent application by Kenneth D. Krossa and Michael I. Behr, describes other alternatives. Irrespective of the initial gain state for this circuit however, it should be clear that a change in gain level can be easily and quickly accomplished in that only one representative sample pulse is required by the gain controlling circuit of this invention. Furthermore, this gain controlling circuit eliminates any change in direct current operating conditions for the amplifier circuit as discussed hereinafter.

Diodes 52 and 54 are chosen so as to have matched dynamic resistance, and likewise resistors 57 and 58 are matched. Accordingly, whenever there is conduction through these diodes from source 49 the matched twin circuit effect allows equal amounts of current to flow through the transformer winding 46B in opposite direction to ground. The electric field built up by passage of this direct current through equal portions of transformer 46B in opposite directions cancels out, and there is no net transient signal caused by the magnetic coupling between windings 46A and 46B of transformer 46. The same operation takes place in a reverse direction when diodes 52 and 54 are back-biased and again no transient signals are induced into the amplifier and its associated output circuitry.

Recovery time for the amplifier circuit of this invention may be varied by proper selection of the values for resistors 45, 56, 57, 58 and the inductance of transformer 46, or these elements might be made variable. If variable, however, any variation in the value of either resistor of pair 57 and 58 must also be made in the other resistor in order that the circuit remain matched and thus eliminate all transients from the amplifier circuit during gain changing operations. The recovery time for the amplifier circuit of this invention either by proper selection or by varying the values of the above resistors and the inductance of transformer 46 can be established at any desired time constant and can best be expressed mathematically in connection with one specific illustrative embodiment of an amplifier such as that shown in FIG. 2.

In FIG. 2, a two stage difference amplifier is shown as one possible replacement for the blocks 40 and 41 of the circuit of FIG. 1. In the circuit of FIG. 2, much of the circuitry of FIG. 1 is reproduced, and where that is the case, the same numbers and primes are used for the same components. Thus, the first transistor amplifier is number 40 in the upper or positive peak amplifier and 40' in the lower or negative peak amplifier, and the upper and lower transistors of the second amplification stage are numbered 41 and 41' respectively. The positive and negative bias sources 37 and 38 and associated biasing resistors and capacitors are provided for the amplifier of FIG. 2, and are chosen in a well known manner so that the amplifier may be biased for class A operation.

It is typical to employ differences amplifiers, such as that of FIG. 2, in an information recovery system because most information recovery heads are center tapped transformers which deliver positive and negative signals of equal emplitude for each pulse of information recovered from a storage device, such as a disk store 10 of FIG. 1. The output for each of these heads thus comprise a pair of leads which are connected through a head select matrix and pre-amplification circuit 20 such as that shown in FIG. 1, to a final amplifier stage such as multi-gain amplifier 25. Typical information signals which have been recovered and preamplified are shown applied to the input terminals 39 and 39' of FIG. 2. Each of these input signals are shown having an input time constant $t_1$. The output for the amplifier of FIG. 2, is determined by the voltage developed by the current through feedback resistors 42 and 42'. The output waveforms which will appear at the output terminals 61 and 61' of differential amplifier of FIG. 2, will have a time constant which can be derived by using a Laplace Transform as follows:

$$(1)\quad e_{out}=\frac{(SL_p+R_1)Z_f}{\left(S+\frac{1}{t_1}\right)[L_p(R_1+R_r)S+R_1R_r]}$$

$$(2)\quad =\frac{Z_f(SL_p+R_1)/L_p(R_1+R_r)}{\left(S+\frac{1}{t_1}\right)\left[S+\frac{R_1R_r}{L_p(R_1+R_r)}\right]}$$

$$(3)\quad =\frac{K_1}{S+\frac{1}{t_1}}+\frac{K_2}{S+\frac{R_1||R_r}{L_p}}$$

Where $L_p$ is the inductance of the primary winding 46A of transformer 46, $R_1$ is the value of resistance 45, $Z_f$ is the value of the feedback impedance 42, and where $R_r$ is the reflected impedance for the various gain situations described hereinbefore, $K_1$ and $K_2$ are constants and $||$ is the conventional mathematical symbol denoting a parallel resistance combination formed by the resistances on each side of the symbol.

As shown by Equation 3, for any certain input time constant $t_1$ the output can be optimized by choosing proper values for resistance 45, the reflected resistance, and the inductance of primary winding 46A. The overall recovery time in the amplifier circuit will of course depend upon the magnitudes and the signs of constants $K_1$ and $K_2$. For example, if $t_1$ is small compared to $$L_P/R_1||R_r$$

and if $K_1$ and $K_2$ are positive, the recovery time is shortened. Otherwise, if $K_1$ is negative and $K_2$ is positive, the recovery time is lengthened. When $t_1$ and $$L_P/R_1||R_r$$

are compatible, the output will have a waveform composed of a short time-constant uprising portion and a long time constant decaying portion.

It is extremely important to have a gain control circuit with a controllable time constant in many applications where the information head transformers and the pre-amplification transformers may have introduced unavoidable distortion in the signals which have been recovered. For example, if the recovered signal after pre-amplification has a long delaying exponential function it is desirable to compensate for the delaying portion of the signal during final amplification, in order to deliver well shaped signals to the utilization circuit. By choosing the proper resistance values, in accordance with the foregoing, for the gain controlling circuit of this invention, this compensation may be achieved without introducing any signal transients into the amplifier circuitry when a gain changing operation is performed.

It should be understood that the gain controlling circuit of this invention has been described only in connection with a multi-gain amplifier having two gain level steps, namely, a high gain and a low gain. This description should not, of course, be taken as limiting because it is within the principles of this invention to employ other resistors and diodes in matched twin circuits and controlled by a switching transistor and its control circuit in order to achieve a multi-gain amplifier which has several different gain settings. These other circuits, for example, could be essentially distinct circuits inductively coupled to the primary winding 46A, or they could share the secondary nad resistor 56 as shown for example by the broken connection lines 53 and 53'.

It should further be understood that the above-described arrangements are merely illustrative of the principle of this invention. Numerous other arrangements may be devised by those skilled in the art without departing from the principles of this invention.

What is claimed is:

1. In a gain-setting switching circuit operative in response to automatically generated digital levels for establishing distinct gain settings in a single-passing amplifier having a gain dependent upon the resistance appearing at a gain control junction, the combination comprising:

a digital level emitting circuit including a detector circuit operative in conjunction with the amplifier output and having a predetermined threshold level for emitting one of two possible output signal levels whenever the amplifier signals passed by said amplifier are respectively less or greater than said threshold level; and a bistable control means set normally in one digital output state and connected to said detector circuit and responsive thereto, for either holding said one state or for assuming and holding a second digital output state;

said gain-setting switching circuit being operative in response to said digital level emitting circuit for establishing transient-free gain settings in said amplifier, said gain-setting circuit including a first winding connected between ground and said gain control junction of said amplifier;

a second winding inductively coupled to said first winding and having a pair of input terminals and a grounded center tap;

a circuit selevtively operative for establishing distinct resistance values connected to said second winding, said circuit comprising a first resistance connected across said pair of input terminals of said second windings;

a pair of twin circuits one each connected to one each of said input terminals of said pair, each one of said twin circuits including matched diodes and matched resistances connected in series;

a bias source connected in common to said pair of twin circuits and poled to conduct current through said twin circuits to said grounded center tap;

a switching device connected to said bias source and selectively operative for interrupting or establishing said current flow through said twin circuits; and logic gating means connected between said switching device and said bistable control means for selectively opening or closing said switching device in response to the output states of said bistable control means.

2. A switching circuit for providing transient-free gain settings in a signal passing amplifier having a gain function dependent upon the resistance appearing at a gain control junction comprising, a first winding connected between ground and said gain control junction, means connected to the output of said amplifier for emitting digital levels representative of a required increase or decrease in the gain setting for said amplifier, a first resistance, means responsive to said digital levels for selectively establishing or interrupting matched resistance circuits in a parallel current-conducting path with said first resistance, each selective establishment or interruption of said current-conducting path introducing current transients in said path, means for applying said digital levels from said emitting means to said means for selectively establishing or interrupting said matched resistance circuits, and a second winding inductively coupled to said first winding, said second winding including a grounded center tap and means connecting said second winding in parallel with said first resistance for reflecting in said first winding said first resistance and said first resistance in parallel with the matched resistance circuits and for isolating said first winding and therefore said amplifier from said current transients.

3. A circuit for providing transient-free gain settings in an amplifier for amplifying information-containing signals and presenting them at an output to a utilization circuit, said amplifier being capable of assuming a plurality of distinct gain settings as a function dependent upon the value of resistances appearing at a gain controlling junction, said circuit comprising a first resistance means, at least one pair of series circuits each comprising a resistor connected to a diode, means connecting said series circuits in parallel with said first resistance means to establish a second resistance value, a source of bias potential connected in common to said series circuits and having a polarity poled relative to said diodes for conducting current therethrough, switching means connected to said bias source and selectively operative for interrupting and establishing current flow in said series circuits, said selectively established and interrupted current flow introducing current transients with each change in current condition in said series circuits, a first winding connected in series between ground and said gain controlling junction, and a second winding connected in parallel across said first resistance means and inductively coupled to said first winding for reflecting said first resistance and said second resistance value to said first winding, said second winding further having a grounded center tap for isolating said first winding and said amplifier from said current transients.

4. A gain control circuit for providing distinct transient-free gain settings in a signal-passing amplifier having a gain function dependent upon the resistance appearing at a gain control junction comprising, a first winding connected in a first series circuit with a first resistance means and means connecting said series circuit between said gain control junction and a common reference potential;

a second winding inductively coupled to said first winding and having two end terminals, and further having a center tap terminal at said common reference potential;

a second resistance connected across said two end terminals for reflecting one gain setting resistance to said first winding;

a circuit pair operative when current conducting for reflecting another gain-setting resistance in said first winding, each circuit of said pair comprising one of a pair of unilateral current conducting devices having matched dynamic resistances when in a current conducting condition;

transistor switching means having a control lead, a bias lead, and an output lead connected to said circuit pair;

a source of potential connected to said bias lead and biasing said transistor in one current conducting state for maintaining said unilateral current conducting devices in a back-biased condition for reflecting only said one gain-setting resistance to said first winding;

means connected to an output of said amplifier for emitting a digital level representative of a required gain setting in said amplifier, and digital level applying means connected between the digital level emitting means and said transistor control lead for changing its current-conducting state, the conductive condition in said unilateral conducting devices, and for reflecting said other gain-setting resistance to said first winding.

5. A gain control circuit in accordance with claim 4 and further having a controllable output time constant for the output signals passed by the amplifier wherein, said amplifier is a difference amplifier having a feedback resistance $Z_f$, and an output time constant defined by the Laplace Transform of:

$$e_{\text{output}}=\frac{Z_f(SL_p+R_1)/L_p(R_1+R_r)}{\left(S+\frac{1}{t_1}\right)\left[S+\frac{R_1R_r}{L_p(R_1+R_r)}\right]}$$

which may be written as:

$$e_{\text{output}}=\frac{K_1}{S+\frac{1}{t_1}}+\frac{K_2}{S+\frac{R_1||R_r}{L_p}}$$

wherein $L_p$ is the inductance of said first winding, $R_1$ is the resistance value of said first resistance means, $R_r$ is the resistance value of said reflected resistances, and $K_1$ and $K_2$ are constants.

References Cited

UNITED STATES PATENTS 3,032,719 5/1962 Beck ---------------- 330—29

FOREIGN PATENTS 807,815 1/1959 Great Britain.

ROY LAKE, *Primary Examiner*.

J. B. MULLINS, *Assistant Examiner*.